United States Patent [19]
Katoh

[11] Patent Number: 6,087,687
[45] Date of Patent: Jul. 11, 2000

[54] MISFET DEVICE WITH FERROELECTRIC GATE INSULATOR

[75] Inventor: Yuukoh Katoh, Tokyo, Japan

[73] Assignee: NEC Corporation, Tokyo, Japan

[21] Appl. No.: 08/856,803

[22] Filed: May 15, 1997

[30] Foreign Application Priority Data

May 15, 1996 [JP] Japan ..................................... 8-120323

[51] Int. Cl.[7] .................................................. H01L 29/94
[52] U.S. Cl. ............................ 257/295; 257/33; 257/35; 257/190; 365/145
[58] Field of Search ............................... 257/33, 35, 295, 257/190; 365/145

[56] References Cited

U.S. PATENT DOCUMENTS

| | | | |
|---|---|---|---|
| 5,270,231 | 12/1993 | Sameshima et al. | 437/40 |
| 5,274,249 | 12/1993 | Xi et al. | 257/39 |
| 5,303,182 | 4/1994 | Nakao et al. | 365/145 |
| 5,621,681 | 4/1997 | Moon | 365/145 |
| 5,696,392 | 12/1997 | Char et al. | 257/190 |

OTHER PUBLICATIONS

Japanese Office Action, dated Dec. 1, 1998, with English language translation of Japanese Examiner's comments.

*Primary Examiner*—Valencia Martin-Wallace
*Attorney, Agent, or Firm*—Whitham, Curtis & Whitham

[57] ABSTRACT

A semiconductor device is provided, which is readily and correctly designed even when the semiconductor device is further miniaturized. This device includes a semiconductor substrate, a source region and a drain region formed to be apart from each other in the substrate, a gate insulator formed on a main surface of the substrate, and a gate electrode formed on the gate insulator. The gate insulator includes a ferroelectric region and a dielectric region located in a same level as that of the ferroelectric region. The ferroelectric region is contacted with the main surface of the substrate and the gate electrode. The dielectric region is contacted with the main surface of the substrate and the ferroelectric region. The whole bottom of the ferroelectric region is contacted with the main surface of the substrate in such a way that no overlap exists between the ferroelectric region and the dielectric region.

7 Claims, 9 Drawing Sheets

MISFET DEVICE WITH FERROELECTRIC GATE INSULATOR

BACKGROUND OF THE INVENTION

1. Field of the Invention

The present invention relates to a semiconductor device and a fabrication method thereof and more particularly, to a semiconductor device with a Metal-Insulator-Semiconductor Field-Effect Transistor (MISFET) a gate insulator of which includes a ferroelectric, and a fabrication method of the device.

2. Description of the Prior Art

A ferroelectric has a property or character that a dielectric polarization is generated by an applied external electric field and that the dielectric polarization remains even in the absence of the external electric field. The remaining dielectric polarization is termed a "remanent polarization".

Utilizing the "remanent polarization" enables the formation of a nonvolatile semiconductor memory device.

Specifically, in the case where a ferroelectric is used as part of a gate insulator of a MISFET, a gate voltage, which is applied across a gate electrode and a semiconductor substrate on which the MISFET is formed, causes a dielectric polarization in the ferroelectric. The dielectric polarization thus caused remains even after the application of the gate voltage is stopped. In other words, a "remanent polarization" is generated in the ferroelectric after stopping the application of the gate voltage.

The remanent polarization induces electric charges in the opposing surface region of the substrate to the ferroelectric (i.e., a channel region of the MISFET). This means that the MISFET is kept in the ON state by the remanent polarization even in the absence of the gate voltage.

To turn the MISFET off, a reverse gate voltage is applied across the gate electrode and the substrate to remove the remanent polarization in the ferroelectric.

Thus, the MISFET including the ferroelectric in the gate insulator is capable of a nonvolatile memory function.

A conventional semiconductor device of this sort is shown in FIGS. 1 and 2, which was disclosed in the Japanese Non-Examined Patent Publication No. 2-90571 published in March 1990.

The conventional semiconductor device of FIGS. 1 and 2 is fabricated through the following process steps.

First, an isolation oxide layer 127 is selectively formed on a p-type silicon substrate 126, defining a plurality of device regions on the substrate 126. The substrate 126 is exposed from the isolation oxide layer 127 in the device regions.

In FIGS. 1 and 2, however, only one of the device regions is shown for the sake of simplification of description.

Next, a bismuth titanate ($Bi_4Ti_3O_{12}$) layer 128 as a ferroelectric layer is formed on the field oxide layer 127 and the exposed substrate 126 over the whole substrate 126 by a RF sputtering process. Then, the $Bi_4Ti_3O_{12}$ layer 128 is selectively etched by a reactive ion etching process using a patterned resist mask (not shown), thereby leaving selectively the $Bi_4Ti_3O_{12}$ layer 128 with a rectangular plan shape on the exposed substrate 126. The remaining $Bi_4Ti_3O_{12}$ layer 128 is located on an area corresponding to the central part of a gate insulator 131, which is apart from the isolation oxide layer 127.

Further, the substrate 126 with the remaining $Bi_4Ti_3O_{12}$ layer 128 in the device region is subjected to a thermal oxidation process to form a silicon dioxide ($SiO_2$) layer 129 on the exposed substrate 126 in the device region. The $SiO_2$ layer 129 surrounds the $Bi_4Ti_3O_{12}$ layer 128 in the device region. In other words, the $SiO_2$ layer 129 covers the device region except for the $Bi_4Ti_3O_{12}$ layer 128.

Subsequently, a polysilicon layer (not shown) is formed on the $SiO_2$ layer 129 and the isolation oxide layer 127 by a popular process, and is patterned to form a gate electrode 130 with a rectangular plan shape. The gate electrode 130 is placed on the $Bi_4Ti_3O_{12}$ layer 128 and two parts 129a and 129b of the $SiO_2$ layer 129 that are located at each side of the $Bi_4Ti_3O_{12}$ layer 128. The $Bi_4Ti_3O_{12}$ layer 128 and the parts 129a and 129b of the $SiO_2$ layer 129 constitute a gate insulator 131. The remaining part 129c of the $SiO_2$ layer 129, which is exposed from the gate electrode 130, covers the substrate 126 or device region.

Following this, using the polysilicon gale electrode 130 as a mask, arsenic (As) ions are selectively implanted into the substrate 126 in self-alignment with the gate electrode 130 and the isolation oxide layer 127 through the part 129c of the $SiO_2$ layer 129. As a result, a source region 105 and a drain region 106 are formed in the device region at each side of the gate electrode 130.

The source and drain regions 105 and 106, the gate insulator 131, and the gate electrode 130 constitute a MISFET.

Thus, the conventional semiconductor device of FIGS. 1 and 2 is finished.

In the conventional semiconductor device of FIGS. 1 and 2, the gate insulator 131 of the MISFET is formed by the central part 128 made of $Bi_4Ti_3O_{12}$ (which is a ferroelectric) and the remaining side parts 129a and 129b made of $SiO_2$ (which is a dielectric).

The conventional semiconductor device of FIGS. 1 and 2 operates in the following way.

When a signal voltage is applied to the gate electrode 130, a dielectric polarization occurs in the $Bi_4Ti_3O_{12}$ layer 128 and the parts 129a and 129b of the $SiO_2$ layer 129 according to the polarity of the signal voltage. The dielectric polarization induces electric charges serving as a conductive channel at the corresponding surface area of the substrate 126 to the gate insulator 131.

The electric charges (i.e., the conductive channel) thus generated allow a drain current to flow between the source and drain regions 105 and 106, which means that the MISFET is in the ON state.

When the application of the signal voltage is stopped, the dielectric polarization disappears in the parts 129a and 129b of the $SiO_2$ layer 129. Therefore, the electric charges generated below the parts 129a and 129b disappear. However, a remanent polarization remains in the $Bi_4Ti_3O_{12}$ layer 128 even in the absence of the gate voltage. Consequently, a large part of the electric charges induced below the $Bi_4Ti_3O_{12}$ layer 128 are left, thereby keeping the MISFET in the ON state.

With the conventional semiconductor device of FIGS. 1 and 2, there is an advantage that the level of an output signal is able to be controlled by changing the rate or percentage of the $Bi_4Ti_3O_{12}$ layer 128 with respect to the whole gate insulator 131. In other words, logic circuits providing a multilevel output in response to a two-valued input (i.e., "0" and "1") are able to be designed.

Another conventional semiconductor device of this sort is shown in FIG. 3, which was disclosed in the Japanese Non-Examined Patent Publication No. 6-29549 published in February 1994.

In the conventional semiconductor device of FIG. 3, an n-type source region 205 and an n-type drain region 206 are formed to be apart from each other in a p-type silicon substrate 226. A gate insulator 231 with a two-layer structure is formed on the substrate 226 so as to link the source and drain regions 205 and 206 with each other.

The gate insulator 131 is formed by a $SiO_2$ layer 211 located in a lower level and a lead zirconate titanate (Pb(Zr—Ti)$O_3$, PZT) layer 222 located in an upper level. Unlike the conventional semiconductor device of FIGS. 1 and 2, the PZT layer 222 is not contacted with the substrate 226. The $SiO_2$ layer 211 is contacted with the substrate 226.

A gate electrode 204 is formed on the gate insulator 231. The gate electrode 204 is contacted with the PZT layer 222 in the upper level.

The source and drain regions 205 and 206, the gate insulator 231, and the gate electrode 204 constitute a MISFET.

To adjust the threshold voltage of the MISFET, an ion-implanted region 232 is formed in the surface region of the substrate 226 between the source and drain regions 205 and 206.

With the conventional semiconductor device of FIG. 3, since the gate insulator 231 is formed by the lower layer 211 of a dielectric (i.e., $SiO_2$) and the upper layer 222 of a ferroelectric (i.e., PZT), the substrate 226 is not contacted with the PZT layer 22. Therefore, there is an advantage that the degree of freedom increases in material selection for the gate insulator 231 to thereby improve the surface state of a channel region (i.e., the substrate 226) between the source and drain regions 205 and 206.

Still another conventional semiconductor device of this sort is shown in FIG. 4, which was disclosed in the Japanese Non-Examined Patent Publication No. 5-145077 published in June 1993.

In the conventional semiconductor device of FIG. 4, a p-type well 333 is formed in a silicon substrate (not shown). An n$^+$-type source region 305 and an n$^+$-type drain region 306 are formed to be apart from each other in the p-type well 333. A gate insulator 339 with a three-layer structure is formed on the well 333 to link the source and drain regions 305 and 306 with each other.

The gate insulator 339 includes a dielectric layer 334 made of strontium titanate ($SrTiO_3$) with a high dielectric constant, a conductive layer 335 made of platinum (Pt), and a ferroelectric layer 336 made of lead titanate ($PbTiO_3$, PT). Like the conventional semiconductor device of FIG. 3, the PT layer 336 is not contacted with the well 333 (i.e. the substrate). The $SrTiO_3$ layer 334 is contacted with the well 333.

A gate electrode 337 is formed on the gate insulator 339. A channel region 338 is formed below the gate insulator 339 between the source and drain regions 305 and 306.

With the conventional semiconductor device of FIG. 4, since the gate insulator 339 is formed by the lower layer 334 of a dielectric (i.e., $SrTiO_3$), the middle layer 335 of a conductor (i.e., Pt), and the upper layer 336 of a ferroelectric (i.e., PT), the well 333 or substrate is not contacted with the PT layer 336. Therefore, there is the same advantage as that of the conventional device of FIG. 3.

However, the above-described three conventional semiconductor devices have the following problems.

With the conventional semiconductor device of FIGS. 1 and 2, because the $SiO_2$ layer 129 is formed by the thermal oxidation process, the opposing ends of the layer 129 to the $Bi_4Ti_3O_{12}$ layer 128 are located beneath the $Bi_4Ti_3O_{12}$ layer 128, as clearly shown in FIG. 2. In other words, the periphery of the $Bi_4Ti_3O_{12}$ layer 128 is overlapped with the inner ends of the parts 129a and 129b of the $SiO_2$ layer 129 at corresponding areas 139, respectively.

As a result, an obtainable drain current by the remanent polarization in the $Bi_4Ti_3O_{12}$ layer 128 decreases, the reason of which is as follows.

After selectively forming the $Bi_4Ti_3O_{12}$ layer 128 on the exposed surface of the substrate 126, the $SiO_2$ layer 129 is formed by the thermal oxidation process. During this oxidation process, $SiO_2$ grows not only vertically but also laterally due to oxidation of the surface area of the silicon substrate 126, resulting in the inner ends of the $SiO_2$ layer 129 located under the periphery of the remaining $Bi_4Ti_3O_{12}$ layer 128.

The width of the overlapping areas 139 is typically equal to approximately 20% of the thickness of the $SiO_2$ layer 129. Therefore, the total width of the overlapping areas 139 is equal to approximately 40% of the thickness of the $SiO_2$ layer 129.

In the overlapping areas 139, when a gate voltage is applied across the gate electrode 130 and the substrate 126, the voltage is divided into two by the overlapped layers 129 and 128. This means that the effective voltage applied across the $Bi_4Ti_3O_{12}$ layer 128 decreases in the overlapping areas 139.

Consequently, the obtainable strength of the dielectric polarization (and therefore, remanent polarization) in the $Bi_4Ti_3O_{12}$ layer 128 is reduced. This means that the obtainable value of a drain current by the remanent polarization decreases compared with the case where the overlapping areas 139 do not exist.

Supposing that the whole remanent polarization of the $Bi_4Ti_3O_{12}$ layer 128 in the overlapping areas 139 becomes ineffective, the obtainable value of the drain current will decrease by approximately 40% of the value in the case where no overlapping areas exist. For example, if the $SiO_2$ layer 129 has a thickness of 20 nm, the width of the overlapping areas 139 is approximately 8 nm. If the width of the $Bi_4Ti_3O_{12}$ layer 128 is 0.8 m, the value of 8 nm is equal to 1% of the width of the $Bi_4Ti_3O_{12}$ layer 128. Thus, the drain current will decrease by 1%.

This drain current decrease will become more and more with the progressing device miniaturization.

With the conventional semiconductor device of FIGS. 1 and 2, narrowing the $Bi_4Ti_3O_{12}$ layer 128 makes it possible to decrease the level of a drain current at the time no signal voltage is applied to the gate electrode 130. However, the rate or percentage of the overlapping areas 139 will relatively increase with the progressing device miniaturization and therefore, the obtainable value of a drain current will decrease further.

Consequently, the effect by the overlapping areas 139 to the relationship between the size of the $Bi_3Ti_3O_{12}$ layer 128 and the obtainable value of a drain current will not become negligible.

The shape and structure of the overlapping areas 139 are complicated and the characteristic of the $Bi_4Ti_3O_{12}$ layer 128 is varied or fluctuated according to the magnitude of the applied signal voltage. Accordingly, it is very difficult to estimate in advance the effect of the overlapping areas 139 by calculation.

To correct various errors caused by the overlapping areas 139, a lot of study is essential for the purpose of measuring the relationship between a drain current and the device size. This increases the difficulty in designing the semiconductor devices of this sort.

With the conventional semiconductor device of FIG. 3, the lower $SiO_2$ layer 211 is formed on the substrate 226 to be contacted therewith, and the upper PZT layer 222 is formed on the $SiO_2$ layer 211. Therefore, the peripheral area of the PZT layer 222 tends to be readily oxidized due to the existence of the $SiO_2$ layer 211.

The oxidation of the PZT layer 222 highly affects the relationship between the size of the PZT layer 222 and the obtainable value of a drain current. As a result, the difficulty in device design is further increased.

With the conventional semiconductor device of FIG. 4, the $SrTiO_3$ layer 334 is formed on the well (i.e., the substrate) 333, and the PT layer 336 is formed over the $SrTiiO_3$ layer 334 through the Pt layer 335. Therefore, the PT layer 336 tends to be readily oxidized in the peripheral area of the layer 336.

Thus, there arises the same problem as that of the semiconductor device of FIG. 3.

SUMMARY OF THE INVENTION

Accordingly, an object of the present invention is to provide a semiconductor device that is readily and correctly designed even when the semiconductor device is further miniaturized, and a fabrication method of the device.

Another object of the present invention is to provide a semiconductor device that is able to efficiently utilize the remanent polarization of a ferroelectric, and a fabrication method of the device.

The above objects together with others not specifically mentioned will become clear to those skilled in the art from the following description.

According to a first aspect of the present invention, a semiconductor device is provided, which includes a semiconductor substrate, a source region and a drain region formed to be apart from each other in the substrate, a gate insulator formed on a main surface of the substrate, and a gate electrode formed on the gate insulator.

The gate insulator includes a ferroelectric region and a dielectric region located in a same level as that of the ferroelectric region. The ferroelectric region is contacted with the main surface of the substrate and the gate electrode. The dielectric region is contacted with the main surface of the substrate and the ferroelectric region.

The whole bottom of the ferroelectric region is contacted with the main surface of the substrate in such a way that no overlap exists between the ferroelectric region and the dielectric region.

With the semiconductor device according to the first aspect, the gate insulator includes the ferroelectric region and the dielectric region located in the same level as that of the ferroelectric region. The ferroelectric region is contacted with the main surface of the substrate and the gate electrode. The dielectric region is contacted with the main surface of the substrate and the ferroelectric region.

Further, the whole bottom of the ferroelectric region is contacted with the main surface of the substrate in such a way that no overlap exists between the ferroelectric region and the dielectric region.

As a result, no unpredictable change will occur in the relationship between the size of the ferroelectric region and an obtainable value of a drain current due to a remanent polarization to be generated in the ferroelectric region. Consequently, the semiconductor device is able to be readily and correctly designed even when the semiconductor device is further miniaturized.

Additionally, since the whole bottom of the ferroelectric region is contacted with the main surface of the substrate, a remanent polarization of the ferroelectric region is able to be efficiently utilized.

In a preferred embodiment of the semiconductor device according to the first aspect, an additional ferroelectric region is formed on the dielectric region. The additional ferroelectric region is contacted with the dielectric region and the gate electrode.

In another preferred embodiment of the semiconductor device according to the first aspect, the ferroelectric region is made of a ferroelectric material excluding oxygen. The reason is that oxygen badly affects the main surface of the substrate.

As the ferroelectric material excluding oxygen, $BaMgF_4$ is preferably used.

According to a second aspect of the present invention, another semiconductor device is provided, which includes a semiconductor substrate, a source region and a drain region formed to be apart from each other in the substrate, a gate insulator formed on a main surface of the substrate, and a gate electrode formed on the gate insulator.

The gate insulator includes a dielectric layer located in a lower level, and a ferroelectric region and a dielectric region located in an upper level. The dielectric layer is contacted with the main surface of the substrate. The ferroelectric region is located on the dielectric layer or over the dielectric layer through an interleaving region. The dielectric region is contacted with the dielectric layer.

The whole bottom of the ferroelectric region is contacted with the dielectric layer or the interleaving region in such a way that no overlap exists between the ferroelectric region and the dielectric region or the interleaving region.

With the semiconductor device according to the second aspect, the gate insulator includes the dielectric layer located in the lower level and the ferroelectric region and the dielectric region located in the upper level. The ferroelectric region is located on the dielectric layer or over the dielectric layer through the interleaving region. The dielectric region is contacted with the dielectric layer.

Further, the whole bottom of the ferroelectric region is contacted with the dielectric layer in such a way that no overlap exists between the ferroelectric region and the dielectric region or the interleaving region.

As a result, no unpredictable change will occur in the relationship between the size of the ferroelectric region and an obtainable value of a drain current due to a remanent polarization to be generated in the ferroelectric region. Consequently, the semiconductor device is able to be readily and correctly designed even when the semiconductor device is further miniaturized.

Additionally, since the whole bottom of the ferroelectric region is contacted with the underlying dielectric layer, a remanent polarization of the ferroelectric region is able to be efficiently utilized.

In a preferred embodiment of the semiconductor device according to the second aspect, the dielectric layer has a two-layer structure including a lower dielectric sublayer and an upper dielectric sublayer. The upper dielectric sublayer has a function of promoting the crystallization of a layer for the ferroelectric region.

As the upper dielectric sublayer, $CeO_2$ or the combination of Ir and $IrO_2$ is preferably used.

According to a third aspect of the present invention, a fabrication method of a semiconductor device is provided, which includes the following steps:

(a) A semiconductor substrate with a main surface is prepared.

(b) A dielectric layer is formed on the main surface of the substrate. The dielectric layer is contacted with the main surface.

(c) The dielectric layer is selectively etched to form a penetrating window. The main surface of the substrate is exposed from the dielectric layer through the window.

(d) A ferroelectric layer is formed on the dielectric layer to be contacted with the main surface of the substrate through the window of the dielectric layer.

(e) A conductive layer is formed on the ferroelectric layer.

(f) The ferroelectric layer and the conductive layer are patterned to form a gate electrode by the patterned conductive layer. The patterned ferroelectric layer has a same plan shape as that of the gate electrode.

(g) Dopant ions are selectively implanted into the substrate in self-alignment with the gate electrode, thereby forming a source region and a drain region at each side of the gate electrode.

With the fabrication method of a semiconductor device according to the third aspect, the semiconductor device according to the first aspect can be fabricated.

According to a fourth aspect of the present invention, another fabrication method of a semiconductor device is provided, which includes the following steps:

(a) A semiconductor substrate with a main surface is prepared.

(b) A first dielectric layer is formed on the main surface of the substrate. The first dielectric layer is contacted with the main surface.

(c) A ferroelectric layer is formed on the first dielectric layer to be contacted therewith.

(d) A first conductive layer is formed on the ferroelectric layer.

(e) The ferroelectric layer and the first conductive layer are patterned to have a specific plan shape. The patterned ferroelectric and first conductive layers constitute a part of a gate insulator.

(f) A second dielectric layer is formed on the first dielectric layer in such a way that the patterned ferroelectric and first conductive layers are buried in the second dielectric layer.

(g) The surface of the second dielectric layer is planarized until the first conductive layer is exposed from the second dielectric layer.

(h) A second conductive layer is formed on the planarized surface of the second dielectric layer to be contacted with the exposed first conductive layer.

(i) The second conductive layer and the second dielectric layer are patterned to have a plan shape of a gate electrode, thereby forming the gate electrode by the patterned second conductive layer. The first dielectric layer is exposed from the second conductive layer and the second dielectric layer.

(j) Dopant ions are selectively implanted into the substrate in self-alignment with the gate electrode, thereby forming a source region and a drain region at each side of the gate electrode.

With the fabrication method of a semiconductor device according to the fourth aspect, the semiconductor device according to the second aspect can be fabricated.

According to a fifth aspect of the present invention, still another fabrication method of a semiconductor device is provided, which includes the following steps:

(a) A semiconductor substrate with a main surface is prepared.

(b) A first dielectric layer is formed on the main surface of the substrate. The first dielectric layer is contacted with the main surface.

(c) An interleaving layer is formed on the first dielectric layer to be contacted therewith. The interleaving layer includes a ferroelectric sublayer.

(d) The interleaving layer is patterned to have a same width as that of a gate electrode.

(e) Dopant ions are selectively implanted into the substrate in self-alignment with the patterned interleaving layer, thereby forming a source region and a drain region at each side of the interleaving layer.

(f) The interleaving layer is patterned again to have a specific length after the dopant-ion implantation step.

(g) A second dielectric layer is formed on the first dielectric layer in such a way that the interleaving layer that have been patterned two times are buried in the second dielectric layer.

(h) The surface of the second dielectric layer is planarized until the patterned interleaving layer is exposed from the second dielectric layer.

(i) A first conductive layer is formed on the planarized surface of the second dielectric layer to be contacted with the exposed interleaving layer.

(j) The first conductive layer is patterned to have a plan shape of the gate electrode, thereby forming the gate electrode by the patterned first conductive layer.

With the fabrication method of a semiconductor device according to the fifth aspect, the semiconductor device according to the second aspect can be fabricated.

According to a sixth aspect of the present invention, a further fabrication method of a semiconductor device is provided, which includes the following steps:

(a) A semiconductor substrate with a main surface is prepared.

(b) A first dielectric layer is formed on the main surface of the substrate. The first dielectric layer is contacted with the main surface.

(c) An interleaving layer is formed on the first dielectric layer to be contacted therewith.

(d) The interleaving layer is patterned to have a specific plan shape.

(e) A second dielectric layer is formed on the first dielectric layer in such a way that the interleaving layer is buried in the second dielectric layer.

(f) The second dielectric layer subjected to a heat treatment, thereby forming selectively a ferroelectric region on the patterned interleaving layer from the second dielectric layer. The remaining second dielectric layer located outside the patterned interleaving layer is kept dielectric. The ferroelectric region is exposed from the remaining second dielectric layer.

(g) A first conductive layer is formed on the second dielectric layer to be contacted with the exposed ferroelectric region.

(h) The first conductive layer is patterned to have a specific plan shape, thereby forming a gate electrode.

(i) Dopant ions are selectively implanted into the substrate in self-alignment with the gate electrode, thereby forming a source region and a drain region at each side of the gate electrode.

With the fabrication method of a semiconductor device according to the sixth aspect, the semiconductor device according to the second aspect can be fabricated.

According to a seventh aspect of the present invention, a still further fabrication method of a semiconductor device is provided, which includes the following steps:

(a) A semiconductor substrate with a main surface is prepared.
(b) A first dielectric layer is formed on the main surface of the substrate. The first dielectric layer is contacted with the main surface.
(c) A second dielectric layer is formed on the first dielectric layer to be contacted therewith.
(d) The second dielectric layer is selectively exposed to light, thereby forming selectively a ferroelectric region in the second dielectric layer. The remaining second dielectric layer is kept dielectric. The ferroelectric region is exposed from the second dielectric layer.
(e) A first conductive layer is formed on the second dielectric layer to be contacted with the ferroelectric region.
(f) The first conductive layer is patterned to have a specific plan shape, thereby forming a gate electrode.
(g) Dopant ions are selectively implanted into the substrate in self-alignment with the gate electrode, thereby forming a source region and a drain region at each side of the gate electrode.

With the fabrication method of a semiconductor device according to the seventh aspect, the semiconductor device according to the second aspect can be fabricated.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
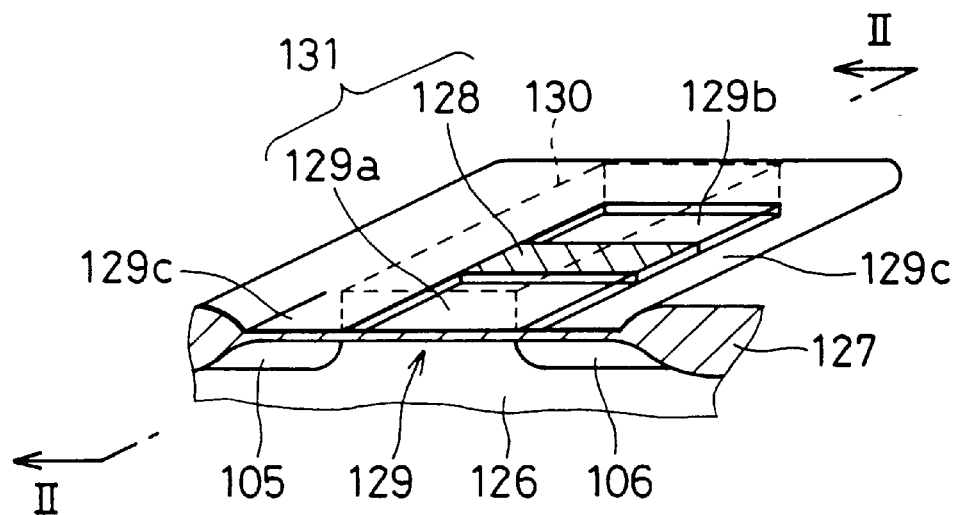
FIG. 1 is a schematic perspective view showing a main part of a conventional semiconductor device.

Preferred embodiments of the present invention will be described below referring to the drawings attached.

FIRST EMBODIMENT

Figure 5:
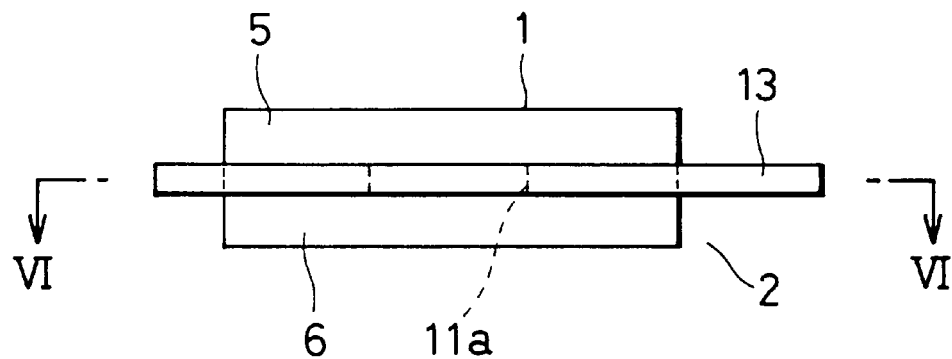
FIG. 5 is a schematic plan view showing a main part of a semiconductor device according to any one of first to sixth embodiments of the present invention.
Figure 6:
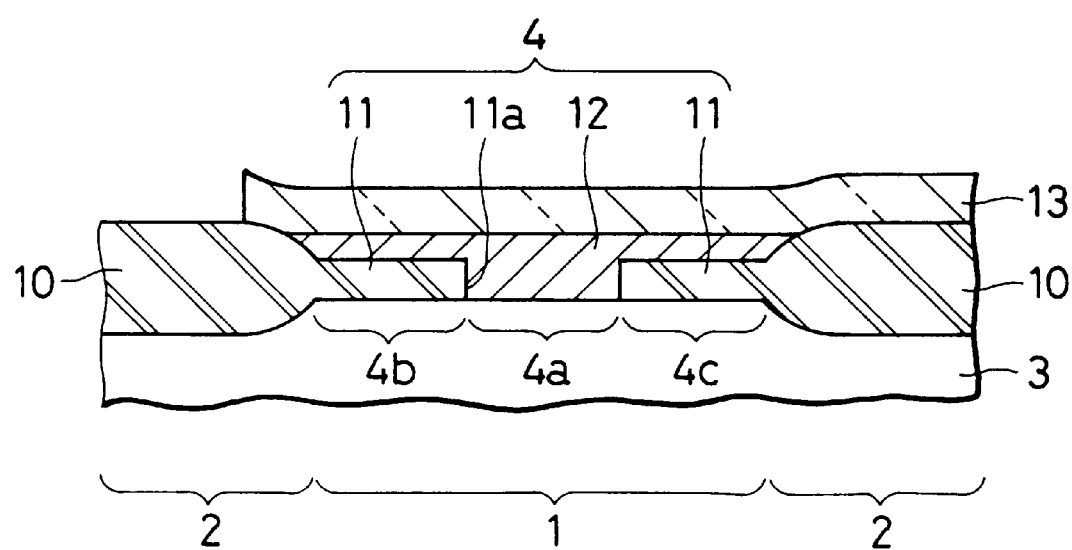
FIG. 6 is a partial cross-sectional view showing a main part of the semiconductor device according to the first embodiment of the present invention, which is along the line VI—VI in FIG. 5.

A semiconductor device with a MISFET according to a first embodiment is shown in FIGS. 5, and 6, in which a patterned field oxide layer 10 made of $SiO_2$ is formed on a main surface of a silicon substrate 3, defining a plurality of device regions 1 each having a rectangular plan shape on the substrate 3. The plurality of device regions 1 are electrically isolated by the field oxide layer 10.

The bottom of the field oxide layer 10 is lower than the surface of the substrate 3 and the top of the layer 10 is higher than the surface thereof. The field oxide layer 10 defines an isolation region 2.

For the sake of simplification, only one of the device regions is shown and explained in the following description.

A thin $SiO_2$ layer 11 is formed on the exposed main surface of the substrate 10 to be contacted therewith in the device region 1. The dielectric layer 11 has a penetrating window 11a with a rectangular plan shape at approximately the center of the device region 1. The dielectric Layer 11 contacts the underlying main surface of the substrate 3 in the whole device region 1 except for the window 11a. The main surface of the substrate 3 is exposed from the dielectric layer 11 through the window 11a. The periphery of the dielectric layer 11 is joined to the opposing end of the field oxide layer 10.

A ferroelectric layer 12, which is made of barium magnesium fluoride ($BaMgF_4$), is formed on the dielectric layer 11 of $SiO_2$ to be contacted therewith. The ferroelectric layer 12 is further contacted with the underlying substrate 3 through the window 11a of the dielectric layer 11. The periphery of the ferroelectric layer 12 is located on the field oxide layer 2, as clearly seen from FIG. 6. The ferroelectric layer 12 has a linear plan shape and selectively covers the device region 1. Here, the top of the ferroelectric layer 12 is slightly lower than the top of the field oxide layer 10.

As clearly shown in FIG. 5, a gate electrode 13 of the MISFET, which has a linear plan shape, is formed to intersect the device region 1. The gate electrode 13 extends along the longitudinal axis of the device region 1 to be contacted with the underlying ferroelectric layer 12 and the field oxide layer 10. The gate electrode 13 runs through the widthwise center of the device region 1. The gate electrode 13 has the same plan shape as that of the ferroelectric layer 12, and overlaps with the ferroelectric layer 12.

A source region 5 and a drain region 6 of the MISFET are formed in the surface region of the substrate 3 in the device region 1. The source and drain regions 5 and 6 are symmetrically located at each side of the gate electrode 13. In other words, the gate electrode 13 is placed between the source and drain regions 5 and 6.

The window 11a of the dielectric layer 11 has a width equal to the width of the gate electrode 13, as clearly shown in FIG. 5.

A channel region is formed in the surface region of the substrate 3 between the source and drain regions 5 and 6 beneath the gate electrode 13.

The dielectric layer 11 made of $SiO_2$ and the ferroelectric layer 12 made of $BaMgF_4$ constitute a gate insulator 4 of the MISFET. The central part 4a of the gate insulator 4 is a single-layer structure formed by the central part of the ferroelectric layer 12. Each of side parts 4b and 4c of the gate insulator 4 is a two-layer structure formed by a corresponding part of the dielectric layer 11 and a corresponding side part of the ferroelectric layer 12.

The $BaMgF_4$ layer 12 has a high dielectric constant of approximately 9. The $SiO_2$ layer 11 has a low dielectric constant of approximately 3.9, which is lower than that of the layer 12.

The above-described semiconductor device according to the first embodiment is fabricated through the following process steps.

Figure 7A:
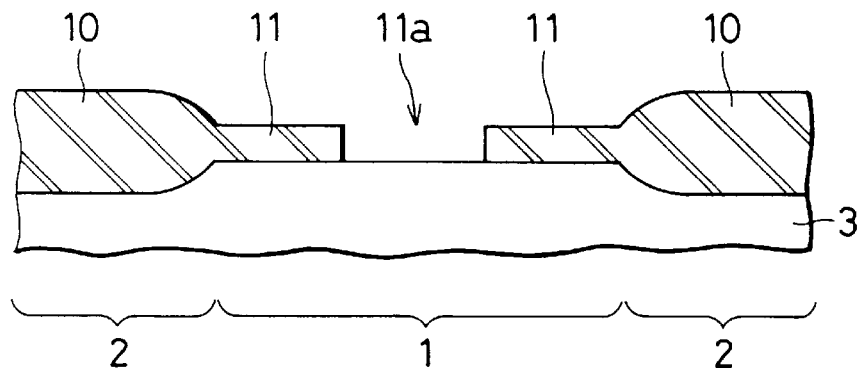
FIGS. 7A and 7B are partial cross-sectional views showing a fabrication method of the semiconductor device according to the first embodiment, respectively.

First, the isolation oxide layer 10 is selectively formed on the main surface of the silicon substrate 3, defining the device region 1 on the substrate 3 by the isolation region 2. The substrate 3 is exposed from the field oxide layer 10 in the device region 1, as shown in FIG. 7A.

Next, the substrate 3 with the field oxide layer 10 is subjected to a thermal oxidation process to form a $SiO_2$ layer 11 with a thickness of approximately 50 nm on the exposed main surface of the substrate 3 in the device region 1. The $SiO_2$ layer 11 covers the whole device region 1 and is contacted with the whole, exposed main surface of the substrate 3.

Then, the $SiO_2$ layer 11 is selectively etched by a hydrofluoric acid to form the penetrating window 11a. The state at this stage is shown in FIG. 7A.

Figure 7B:
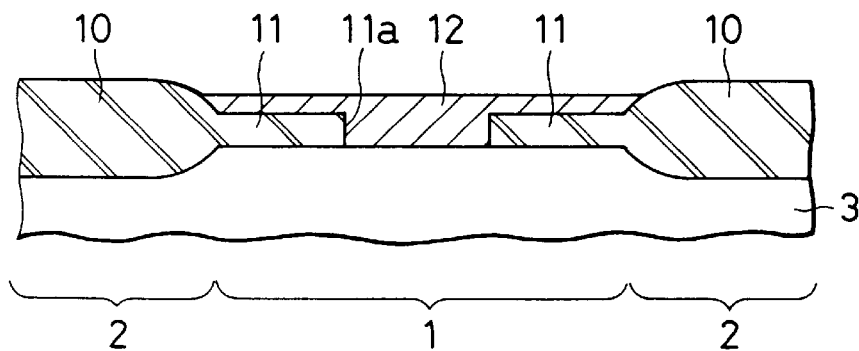

Subsequently, a thick $BaMgF_4$ layer with a thickness of approximately 400 nm is grown on the dielectric layer 11 and the field oxide layer 10 over the whole substrate 3 by a Molecular-Beam Epitaxy (MBE) process. Then, the $BaMgF_4$ layer is etched back to planarize its surface, thereby forming the ferroelectric layer 12, as shown in FIG. 7B. The ferroelectric layer 12 is contacted with the underlying substrate 3 through the window 11a of the dielectric layer 11.

Subsequently, an aluminum (Al) layer (not shown) with a thickness of approximately 500 nm is formed on the ferroelectric layer 12 and the field oxide layer 10 over the whole substrate 3 by a popular process. The Al layer and the underlying ferroelectric layer 12 are then patterned by a dry etching or milling process to have the same linear plan shape with a width of approximately 1 μm as that of the gate electrode 13.

Following this, using the Al gate electrode 13 as a mask, proper dopant ions are selectively implanted into the substrate 3 in self-alignment with the gate electrode 13 and the field oxide layer 10 through the dielectric layer 11. As a result, the source region 5 and the drain region 6 are formed in the device region 1 at each side of the gate electrode 13.

Thus, the semiconductor device according to the first embodiment of FIGS. 5 and 6 is finished.

With the semiconductor device according to the first embodiment of FIGS. 5 and 6, the central part 4a of the gate insulator 4 is a single-layer structure formed by the central part of the ferroelectric (i.e., $BaMgF_4$) layer 12, and each of the side parts 4b and 4c of the gate insulator 4 is a two-layer structure formed by the corresponding part of the lower dielectric ($SiO_2$) layer 11 and the corresponding side part of the upper ferroelectric layer 12. Therefore, an obtainable remanent polarization of the ferroelectric layer 12 in the central part 4a of the gate insulator 4 is stronger than that in the side parts 4b and 4c thereof.

Also, since the upper ferroelectric layer 12 is apart from the underlying substrate 3 in the side parts 4b and 4c of the gate insulator 4, the effect of the remanent polarization in the side parts 4b and 4c is negligible for the purpose of the nonvolatile memory function.

Accordingly, only the remanent polarization of the ferroelectric layer 12 in the central part 4a of the gate insulator 4 is effective.

Figure 2:
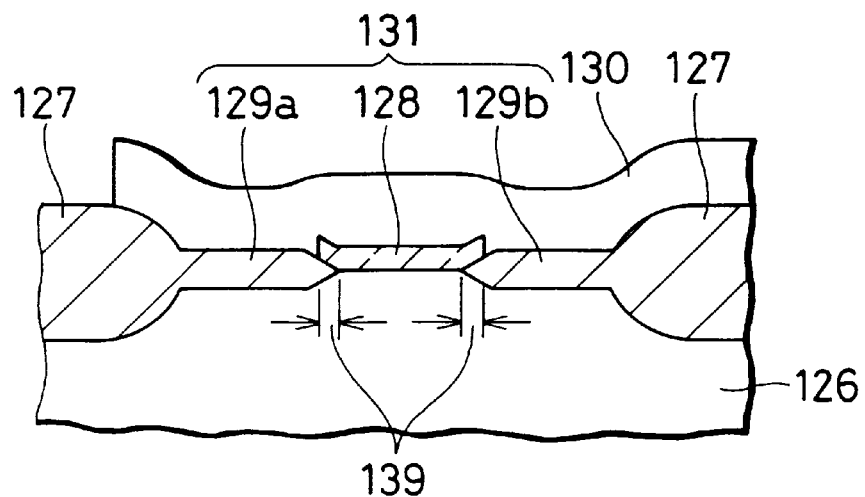
FIG. 2 is a partial cross-sectional view along the line II—II in FIG. 1.
Figure 3:
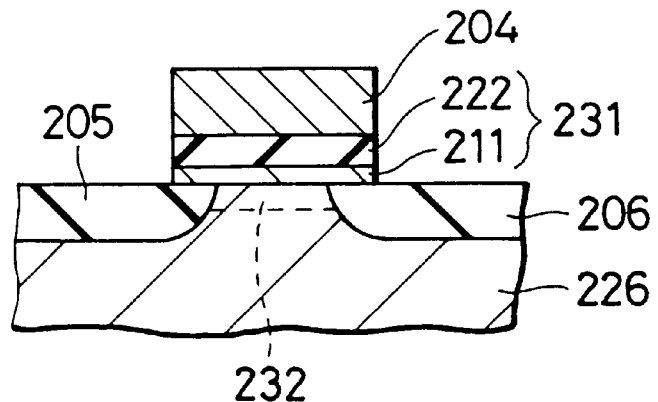
FIG. 3 is a partial cross-sectional view showing a main part of another conventional semiconductor device, which is perpendicular to the gate electrode.
Figure 4:
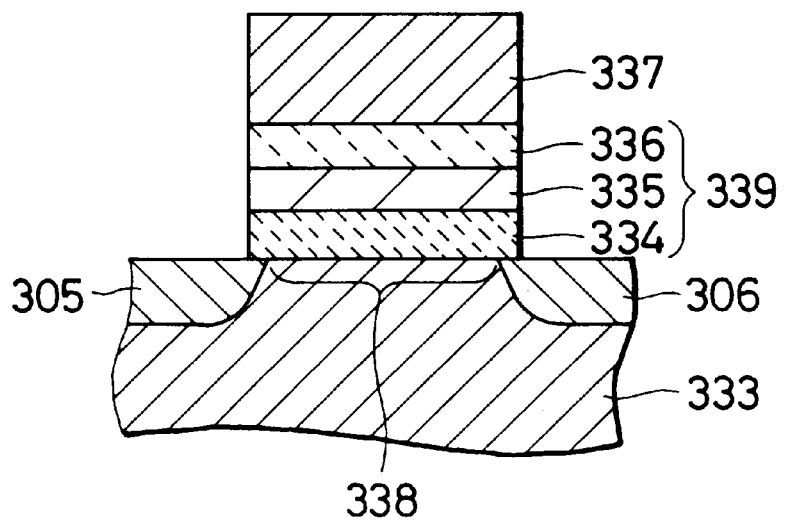
FIG. 4 is a partial cross-sectional view showing a main part of still another conventional semiconductor device, which is perpendicular to the gate electrode.

Further, in contrast to overlapping areas 139 shown in FIG. 2, no overlapping area is formed between the dielectric layer 11 and the ferroelectric layer 12 in the central part 4a of the gate insulator 4. Therefore, the remanent polarization of the ferroelectric layer 12 is able to be efficiently utilized.

Also, because of the same reason, the semiconductor device according to the first embodiment can be readily designed even when the semiconductor device is further miniaturized.

In the semiconductor device according to the first embodiment, the $BaMgF_4$ layer 12 may be replaced with the combination of a lead titanate ($PbTiO_3$, PT) layer and a selenium dioxide ($CeO_2$) layer, which are stacked with each other.

SECOND EMBODIMENT

Figure 8:
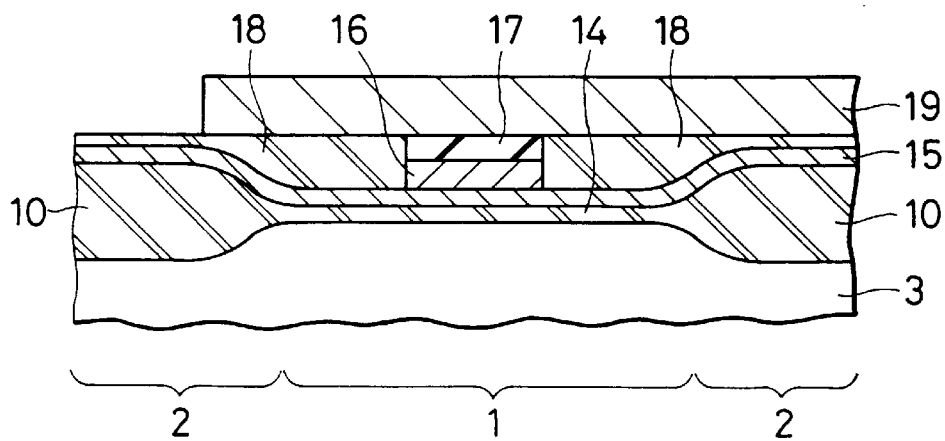
FIG. 8 is a cross-sectional view showing a main part of a semiconductor device according to a second embodiment of the present invention, which is along, the line VI—VI in FIG. 5.

A semiconductor device with a MISFET according to a second embodiment is shown in FIGS. 5 and 8, in which the substrate 3, the device region 1, the isolation region 2, and the field oxide layer 10 are the same in configuration as those in the first embodiment.

Therefore, for the sake of simplification of description, the description relating to the same configuration is omitted here by adding the same reference numerals in FIG. 8 as those in the device according to the first embodiment.

In the semiconductor device according to the second embodiment, similar to the first embodiment, a thin dielectric layer 14 of $SiO_2$ is formed and is in contact with the exposed surface of the substrate 3 in the device region 1. However, unlike the first embodiment, the dielectric layer 14 has no penetrating window. The thickness of the dielectric layer 14 is smaller than that of the first embodiment.

The dielectric layer 14 is contacted with the underlying substrate 3 in the whole device region 1. The periphery of the dielectric layer 11 is joined to the opposing end of the field oxide layer 10.

A dielectric layer 15 made of selenium dioxide ($CeO_2$) is formed on the dielectric layer 14 and the field oxide layer 10 over the whole substrate 3. The dielectric layer 15 is contacted with the underlying dielectric layer 14 and the field oxide layer 10.

A patterned ferroelectric layer 16 made of $PbTiO_3$ (PT) is formed on the $CeO_2$ layer 15. A patterned conductive layer 17 made of platinum (Pt) is formed on the PT layer 16. The patterned PT layer 16 and the patterned Pt layer 17 have the same rectangular plan shape and are located approximately center of the device region 1.

A dielectric layer 18 made of $SiO_2$ is formed on the Pt layer 17 and the exposed, underlying $CeO_2$ layer 15. The top surface of the SiO₂ layer 18 is planarized and is slightly higher than the top of the CeO₂ layer 15 in the isolation region 2. The top of the Pt layer 17 is exposed from the SiO₂ layer 18.

Similar to the first embodiment, a gate electrode 19 of the MISFET, which has a linear plan shape, is formed to intersect the device region 1. The gate electrode 19 extends along the longitudinal axis of the device region 1 to be contacted with the underlying SiO₂ layer 18. The gate electrode 19 runs through the widthwise center of the device region 1. The gate electrode 19 has the same plan shape as that of the stacked PT and Pt layers 16 and 17, and is completely overlapped with the layers 16 and 17. The stacked ferroelectric and conductive layers 16 and 17 have a width equal to that of the gate electrode 19.

As shown in FIG. 5, a source region 5 and a drain region 6 of the MISFET are formed in the surface region of the substrate 3 in device region 1. The source and drain regions 5 and 6 are symmetrically located at each side of the gate electrode 19. In other words, the gate electrode 19 is placed between the source and drain regions 5 and 6. A channel region is formed in the surface region of the substrate 3 between the source and drain regions 5 and 6 beneath the gate electrode 19. These structures are the same as those of the first embodiment.

The ferroelectric layer 16 of PT, the conductive layer 17 of Pt, the corresponding part of the SiO₂ layer 18, and the corresponding parts of the underlying CeO₂ layer 15 and the SiO₂ layer 14, which are located beneath the gate electrode 19 in the device region 1, constitute a gate insulator 4 of the MISFET.

The above-described semiconductor device according to the second embodiment is fabricated through the following process steps.

Figure 9A:
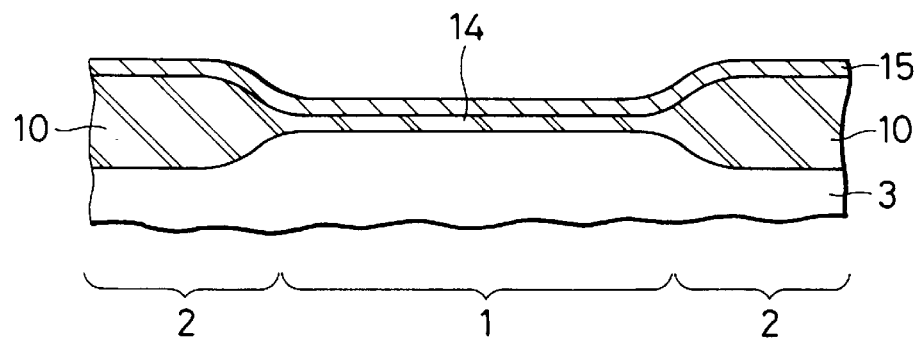
FIGS. 9A to 9C are partial cross-sectional views showing a fabrication method of the semiconductor device according to the second embodiment, respectively.

First, the isolation oxide layer 10 is selectively formed on the main surface of the silicon substrate 3, defining the device region 1 on the substrate 3 by the isolation region 2. The substrate 3 is exposed from the field oxide layer 10 in the device region 1, as shown in FIG. 9A.

Next, the substrate 3 with the field oxide layer 10 is subjected to a thermal oxidation process to form the thin SiO₂ layer 14 with a thickness of approximately 10 nm on the exposed substrate 3 in the device region 1. The SiO₂ layer 14 covers the whole device region 1 and is contacted with the whole, exposed substrate 3.

The SiO₂ layer 14 has a thickness smaller than that in the first embodiment.

Then, the dielectric layer 15 of CeO₂ is formed on the SiO₂ layer 14 and the field oxide layer 10 over the whole substrate 3 by an electron-beam evaporation process. The state at this stage is shown in FIG. 9A.

Figure 9B:
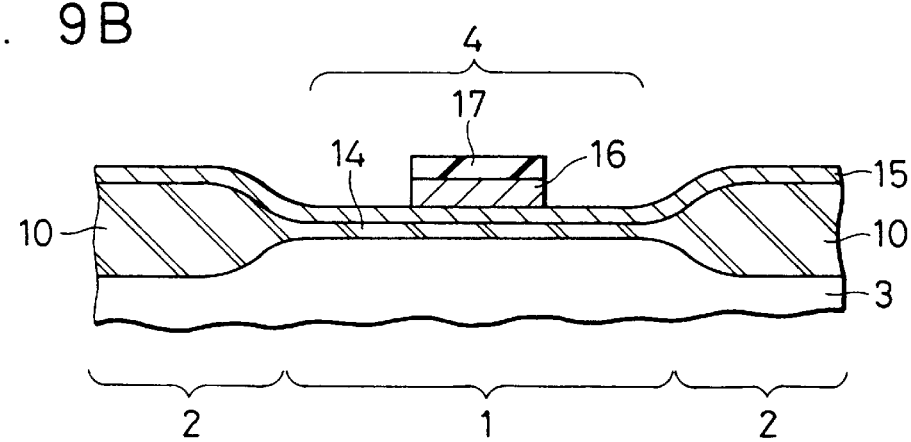

The PT layer 16 with a thickness of approximately 100 and the Pt layer 17 with a thickness of approximately 50 nm are successively formed on the CeO₂ layer 15 by sputtering processes. The two layers 15 and 16 are then patterned to have a rectangular plan shape with a width of approximately 1.5 μm. The state at this stage is shown in FIG. 9B.

Figure 9C:
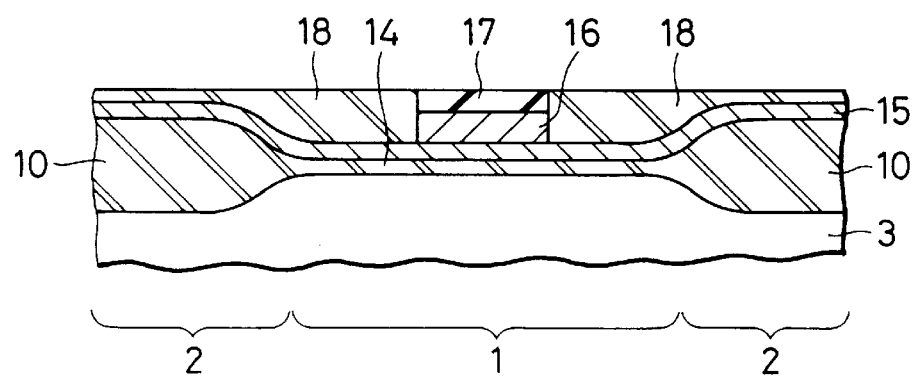

Thereafter, the thick SiO₂ layer 18 with a thickness of approximately 1 μm is formed over the whole substrate 3 by a Chemical Vapor Deposition (CVD) process. The SiO₂ layer 18 thus formed is then polished to planarize its surface by a Chemical Mechanical Polishing (CMP) process until the underlying Pt layer 17 is exposed therefrom. The state at this stage is shown in FIG. 9C.

Subsequently, a platinum (Pt) layer (not shown) is formed on the SiO₂ layer 18 and the exposed Pt layer 17 over the whole substrate 3 by a popular process. The thick Pt layer thus formed is contacted with and electrically connected to the underlying Pt layer 17.

The Pt layer and the underlying thick SiO₂ layer 18 are then patterned by a dry etching or milling process to have a linear plan shape with a width of approximately 1μm narrower than that of the patterned PT and Pt layers 16 and 17. Thus, the gate electrode 19 is formed by the patterned Pt layer.

Then, the exposed CeO₂ layer 15 from the gate electrode 19 is selectively removed by a dry etching process, thereby exposing the underlying SiO₂ layer 14 except for the location beneath the gate electrode 19.

Following this, using the gate electrode 19 as a mask, proper dopant ions are selectively implanted into the substrate 3 in self-alignment with the gate electrode 19 and the field oxide layer 10 through the SiO₂ layer 14. As a result, the source region 5 and the drain region 6 are formed in the device region 1 at each side of the gate electrode 19.

Thus, the semiconductor device according to the second embodiment of FIGS. 5 and 8 is finished.

With the semiconductor device according to the second embodiment, the gate insulator 4 is formed by the patterned ferroelectric (i.e., PT) layer 16, and the SiO₂ layer 18 is formed on the CeO₂ layer 15 to bury the Pt layer 16 and the Pt layer 17. Therefore, no overlapping area is formed between and the ferroelectric layer 16 and the SiO₂ layer 18. This means that the remanent polarization of the ferroelectric layer 16 is able to be efficiently utilized.

Also, because of the same reason, the semiconductor device according to the second embodiment can be readily designed even when the semiconductor device is further miniaturized.

In the second embodiment, even if the Pt layer 17 is partially polished during the CMP process for the SiO₂ layer 18, no problem occurs. The reason is that the thickness of the ferroelectric PT layer 16 is kept unchanged because the layer 18 is located beneath the Pt layer 17.

The CeO₂ layer is, which is similar in crystallographic structure to PT, serves to promote the crystallization of the overlying PT layer 17, thereby facilitating the generation of the ferroelectric property.

The CeO₂ layer 15 serves to protect the underlying SiO₂ layer 14 during the patterning process of the PT and Pt layers 16 and 17, also.

THIRD EMBODIMENT

Figure 10:
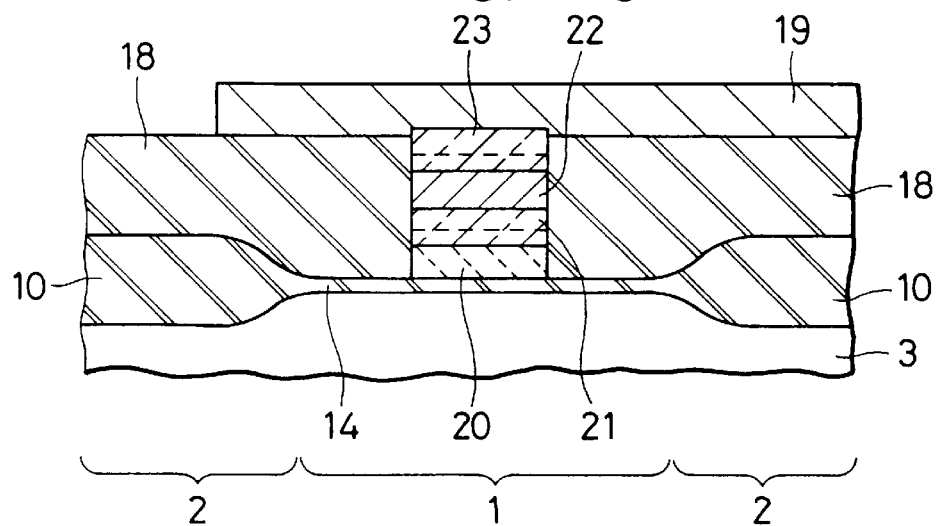
FIG. 10 is a partial cross-sectional view showing a main part of a semiconductor device according to a third embodiment of the present invention, which is along the line VI—VI in FIG. 5.

A semiconductor device with a MISFET according to a third embodiment is shown in FIGS. 5 and 10, in which the substrate 3, the device region 1, the isolation region 2, and the field oxide layer 10 are the same in configuration as those in the first embodiment.

Therefore, for the sake of simplification of description, the description relating to the same configuration is omitted here by adding the same reference numerals in FIG. 10 as those in the device according to the first embodiment.

In the semiconductor device according to the third embodiment, similar to the first embodiment, a thin dielectric layer 14 of SiO₂ is formed and is in contact with the exposed surface of the substrate 3 in the device region 1. However, unlike the first embodiment, the dielectric layer 14 has no penetrating window. The thickness of the dielectric layer 14 is smaller than that of the first embodiment.

The dielectric layer 14 is contacted with the underlying substrate 3 in the whole device region 1. The periphery of the dielectric layer 11 is joined to the opposing end of the field oxide layer 10.

On the thin $SiO_2$ layer 14, a patterned, conductive polysilicon layer 20 is formed to be contacted the $SiO_2$ layer 14. A patterned, conductive $Ir/IrO_2$ layer 21 is formed on the polysilicon layer 20 to be contacted therewith. A patterned PZT layer 22 is formed on the $Ir/IrO_2$ layer 21 to be contacted therewith. A patterned, conductive $Ir/IrO_2$ layer 23 is formed on the PZT layer 22 to be contacted therewith.

The $Ir/IrO_2$ layer 21 has a two-layer structure, which is formed by an upper iridium (Ir) sublayer and a lower iridium dioxide ($IrO_2$) sublayer. Similarly, the $Ir/IrO_2$ layer 23 has a two-layer structure, which is formed by an upper iridium (Ir) sublayer and a lower iridium dioxide ($IrO_2$) sublayer.

The stacked layers 20, 21, 22, and 23 hive the same rectangular plan shape, which are located at approximately the center of the device region 1 under a gate electrode 19 made of Platinum (Pt). The width of the patterned, stacked layers 20, 21, 22, and 23 is equal to the width of the gate electrode 19.

A thick $SiO_2$ layer 18 is formed on the underlying exposed $SiO_2$ layer 14 and the field oxide layer 10. The top surface of the $SiO_2$ layer 18 is planarized and is higher than the top of the field oxide layer 10 in the isolation region 2. The top of the $Ir/IrO_2$ layer 23 in the stacked layers 20, 21, 22, and 23 is exposed from the $SiO_2$ layer 18.

Similar to the first embodiment, the gate electrode 19 of the MISFET, which has a linear plan shape, is formed to intersect the device region 1. The gate electrode 19 extends along the longitudinal axis of the device region 1 and is in contact with the underlying $Ir/IrO_2$ layer 23. The gate electrode 19 runs through the widthwise center of the device region 1. The gate electrode 19 has the same plan shape as that of the stacked layers 20, 21, 22, and 23, and is completely overlapped therewith. The stacked layers 20, 21, 22, and 23 have a width equal to the width of the gate electrode 19.

As shown in FIG. 5, a source region 5 and a drain region 6 of the MISFET are formed in the surface region of the substrate 3 in device region 1. The source and drain regions 5 and 6 are symmetrically located at each side of the gate electrode 19, In other words, the gate electrode 19 is placed between the source and drain regions 5 and 6.

A channel region is formed in the surface region of the substrate 3 between the source and drain regions 5 and 6 beneath the gate electrode 19.

The above-described semiconductor device according to the third embodiment is fabricated through the following process steps.

Figure 11A:
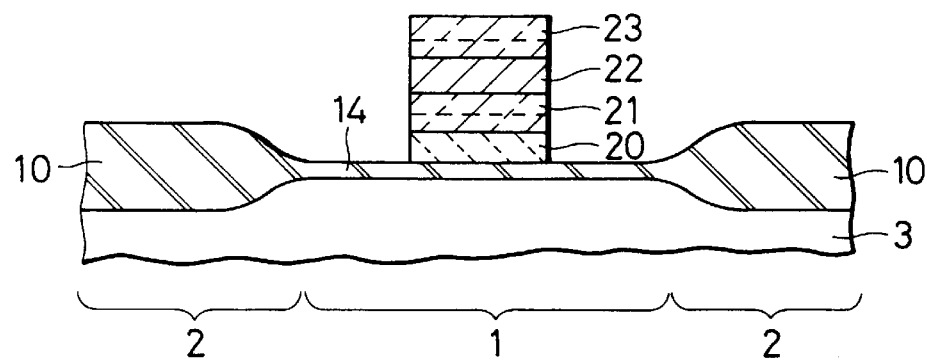
FIGS. 11A and 11B are partial cross-sectional views showing a fabrication method of the semiconductor device according to the third embodiment, respectively.

First, the isolation oxide layer 10 is selectively formed on the main surface of the silicon substrate 3, defining the plurality of device region 1 on the substrate 3 by the isolation region 2. The substrate 3 is exposed from the field oxide layer 10 in the device region 1, as shown in FIG. 11A.

Next, the substrate 3 with the field oxide layer 10 is subjected to a thermal oxidation process to form the $SiO_2$ layer 14 with a thickness of approximately 10 nm on the exposed substrate 3 in the device region 1. The $SiO_2$ layer 14 covers the whole device region 1 and is contacted with the whole, exposed substrate 3.

The above processes are the same as those in the first embodiment.

Then, the conductive polysilicon layer 20 with a thickness of approximately 200 nm is formed on the $SiO_2$ layer 14 and the field oxide layer 10 over the whole substrate 3. The polysilicon layer 20 is contacted with the underlying $SiO_2$ layer 14 and the field oxide layer 10.

Further, the lower $IrO_2$ sublayer of the $Tr/IrO_2$ layer 21 with a thickness of approximately 50 mn is formed on the polysilicon layer 20 to be contacted therewith over the whole substrate 3 by a sputtering process. The upper Ir sublayer of the $Ir/IrO_2$ layer 21 with a thickness of approximately 100 nm is formed on the lower $IrO_2$ sublayer thereof by a sputtering process.

The PZT layer 22 with a thickness of approximately 150 nm is formed on the $Ir/IrO_2$ layer 21 to be contacted therewith over the whole substrate 3 by a sputtering or sol-gel process.

The lower $IrO_2$ sublayer of the $Ir/IrO_2$ layer 23 with a thickness of approximately 50 nm is formed on the PZT layer 22 to be contacted therewith over the whole substrate 3 by a sputtering process. The upper Ir sublayer of the $Ir/IrO_2$ layer 23 with a thickness of approximately 100 nm is formed on the lower $IrO_2$ sublayer thereof by a sputtering process.

Subsequently, the stacked layers 20, 21, 22, and 23 are patterned by a milling or dry etching process to have a linear plan shape extending along the longitudinal axis of the device region 1 through the widthwise center of the device region 1. The stacked layers 20, 21, 22, and 23 run on not only the $SiO_2$ layer 14 but also the field oxide layer 10.

Following this, using the patterned, stacked layers 20, 21, 22, and 23 as a mask, proper dopant ions are selectively implanted into the substrate 3 in self-alignment with the layers 20, 21, 22, and 23 and the field oxide layer 10 through the exposed $SiO_2$ layer 14. As a result, the source region 5 and the drain region 6 are formed in the device region 1 at each side of the gate electrode 19.

Further, the patterned, stacked layers 20, 21, 22, and 23 are patterned again to be selectively left on the $SiO_2$ layer at approximately the center of the device region 1 by milling and dry etching processes, as shown in FIG. 11A. The remaining layers 20, 21, 22, and 23 have a rectangular plan shape the width of which is equal to that of the gate electrode 19.

Thereafter, the thick $SiO_2$ layer 18 with a thickness of approximately 1 μm is formed over the whole substrate 3 by a popular process. The $SiO_2$ layer 18 thus formed is then polished to planarize its surface by a CMP process. Through this CMP process, the $Ir/IrO_2$ layer 23 is not exposed from the $SiO_2$ layer 18.

Figure 11B:
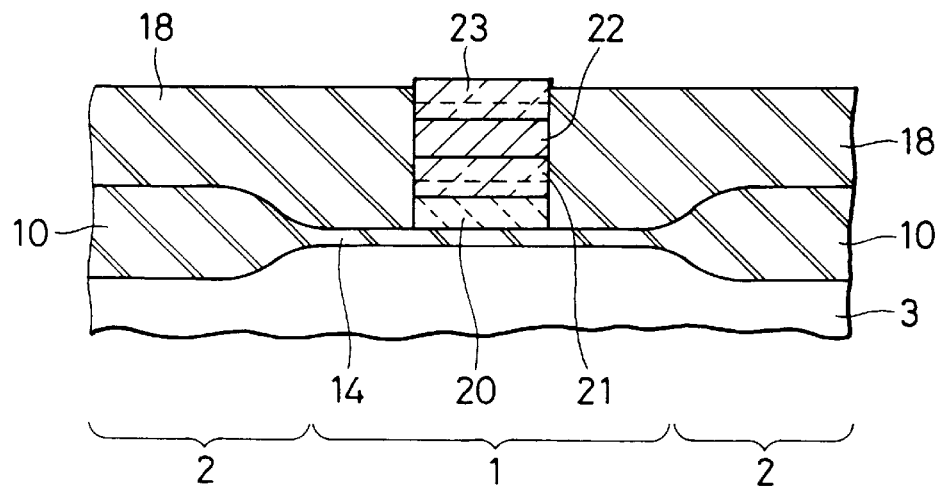

Then, the planarized $SiO_2$ layer 18 is further removed by a dry etching process until the $Ir/IrO_2$ layer 23 is exposed therefrom. The state at this stage is shown in FIG. 11B.

Subsequently, a platinum (Pt) layer (not shown) is formed on the planarized and etched $SiO_2$ layer 18 and the exposed $Ir/IrO_2$ layer 23 over the whole substrate 3 by a popular process. The thick Pt layer thus formed is contacted with and electrically connected to the underlying $Ir/IrO_2$ layer 23.

The Pt layer is then patterned by a milling process to have the linear plan shape, thereby forming the gate electrode 19.

Thus, the semiconductor device according to the third embodiment of FIGS. 5 and 10 is finished.

With the semiconductor device according to the third embodiment, the gate insulator 4 is formed by the patterned, stacked layers 20, 21, 22, and 23, the corresponding part of the thick $SiO_2$ layer 18, and the corresponding part of the $SiO_2$ layer 14. Also, the patterned, stacked layers 20, 21, 22, and 23 are formed on the $SiO_2$ layer 14 so as to bury the stacked layers 20, 21, 22, and 23. Therefore, no, overlapping area is formed between the PZT layer 22 and the SiO$_2$ layer 14 or 18. This means that the remanent polarization of the PZT layer 22 is able to be efficiently utilized.

Also, because of the same reason, the semiconductor device according to the third embodiment can be readily designed even when the semiconductor device is further miniaturized.

In the third embodiment, even if the Ir/IrO$_2$ layer 23 is partially polished during the CMP process for the SiO$_2$ layer 18, no problem occurs. The reason is that the thickness of the ferroelectric PZT layer 22 is kept unchanged because the layer 22 is located beneath the Ir/IO$_2$ layer 23.

Also, the Ir/IrO$_2$ layer 23 serves to prevent the ferroelectric fatigue of the PZT layer 22 from occurring. In the case of a Pt layer as used in the second embodiment, the ferroelectric fatigue of the PZT layer 22 tends to occur.

The Ir/IrO$_2$ layer 23 serves to promote the crystallization of the overlying PZT layer 22, thereby facilitating the generation of the ferroelectric property.

The Ir/IrO$_2$ layer 23 serves to protect the underlying SiO$_2$ layer 14 during the patterning process of the PZT and Ir/IrO$_2$ layers 22, 21, and 23, also.

The polysilicon layer 20 is used for improving the performance in the patterning process of the layers 21, 22, and 23.

FOURTH EMBODIMENT

Figure 12:
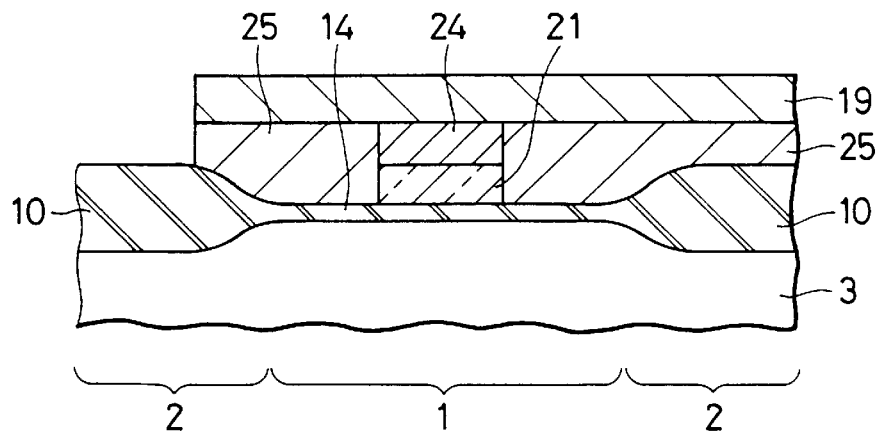
FIG. 12 is a partial cross-sectional view showing a main part of a semiconductor device according to a fourth embodiment of the present invention, which is along the line VI—VI in FIG. 5.

A semiconductor device with a MISFET according to a fourth embodiment is shown in FIGS. 5 and 12, in which the substrate 3, the device region 1, the isolation region 2, and the field oxide layer 10 are the same in configuration as those in the first embodiment.

Therefore, for the sake of simplification of description, the description relating to the same configuration is omitted here by adding the same reference numerals in FIG. 12 as those in the device according to the first embodiment.

In the semiconductor device according to the fourth embodiment, similar to the first embodiment, a thin dielectric layer 14 of SiO$_2$ is formed and is in contact with the exposed surface of the substrate 3 in the device region 1. However, unlike the first embodiment, the dielectric layer 14 has no penetrating window. The thickness of the dielectric layer 14 is smaller than that of the first embodiment.

The dielectric layer 14 is contacted with the underlying substrate 3 in the whole device region 1. The periphery of the dielectric layer 11 is joined to the opposing end of the field oxide layer 10.

On the thin SiO$_2$ layer 14, a patterned, conductive Ir/IrO$_2$ layer 21 is formed on the SiO$_2$ layer 14 to be contacted therewith. The Ir/IrO$_2$ layer 21 has a rectangular plan shape, which are located at approximately the center of the device region 1 under a gate electrode 19 made of Platinum (Pt). The width of the patterned Ir/IrO$_2$ layer 21 is equal to the width of the gate electrode 19.

A patterned, ferroelectric PZT layer 24 is formed on the Ir/IrO$_2$ layer 21 to be contacted therewith. The PZT layer 24 has the same plan shape as that of the underlying Ir/IrO$_2$ layer 21.

A dielectric PZT layer 25 is formed on the underlying thin SiO$_2$ layer 14 and the field oxide layer 10 to bury the Ir/IrO$_2$ layer 21 and the ferroelectric PZT layer 24. The top of the ferroelectric PZT layer 24 is exposed from the dielectric PZT layer 25.

Similar to the first embodiment, the gate electrode 19 of the MISFET, which has a linear plan shape, is formed to intersect the device region 1. The gate electrode 19 extends along the longitudinal axis of the device region 1 to be contacted with the underlying ferroelectric PZT layer 24. The gate electrode 19 runs through the widthwise center of the device region 1. The gate electrode 19 has the same plan shape as that of the stacked layers 21 and 24, and is completely overlapped therewith.

As shown in FIG. 5, a source region 5 and a drain region 6 of the MISFET are formed in the surface region of the substrate 3 in device region 1. The source and drain regions 5 and 6 are symmetrically located at each side of the gate electrode 19. In other words, the gate electrode 19 is placed between the source and drain regions 5 and 6.

A channel region is formed in the surface region of the substrate 3 between the source and drain regions 5 and 6 beneath the gate electrode 19.

The above-described semiconductor device according to the fourth embodiment is fabricated through the following process steps.

Figure 13A:
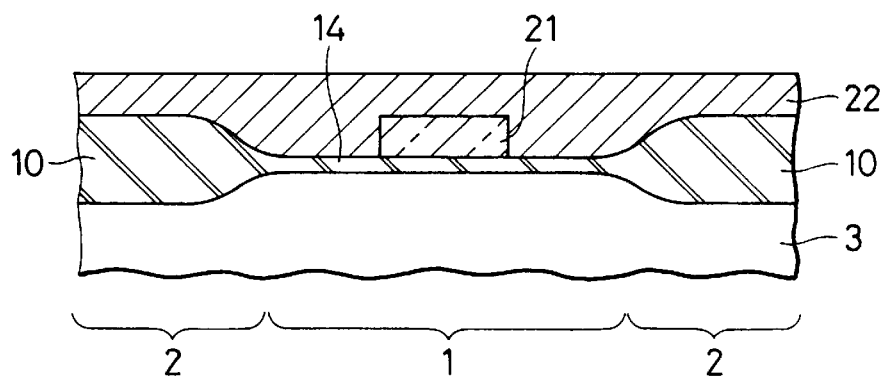
FIGS. 13A and 13B are partial cross-sectional views showing a fabrication method of the semiconductor device according to the fourth embodiment, respectively.

First, the isolation oxide layer 10 is selectively formed on the main surface of the silicon substrate 3, defining the plurality of device regions 1 on the substrate 3 by the isolation region 2. The substrate 3 is exposed from the field oxide layer 10 in the device region 1, as shown in FIG. 13A.

Next, the substrate 3 with the field oxide layer 10 is subjected to a thermal oxidation process to form a SiO$_2$ layer 14 with a thickness of approximately 10 nm on the exposed substrate 3 in the device region 1. The SiO$_2$ layer 14 covers the whole device region 1 and is contacted with the whole, exposed substrate 3.

The above processes are the same as those in the first embodiment.

Then, the lower IrO$_2$ sublayer of the Ir/IrO$_2$ layer 21 with a thickness of approximately 50 nm is formed on the SiO$_2$ layer 14 to be contacted therewith over the whole substrate 3 by sputtering processes. The upper Ir sublayer of the Ir/IrO$_2$ layer 21 with a thickness of approximately 100 nm is formed on the lower IrO$_2$ sublayer thereof to be contacted therewith over the whole substrate 3 by sputtering processes.

Following this, the Ir/IrO$_2$ layer 21 is patterned to have a rectangular plan shape at approximately the center of the device region 1.

A thick PZT layer 22 is formed on the Ir/IrO$_2$ layer 21 over the whole substrate 3 by a sol-gel process. The PZT layer 22 has a dielectric property at this stage. The PZT layer 22 is contacted with not only the Ir/IrO$_2$ layer 21 but also the field oxide layer 10.

Figure 13B:
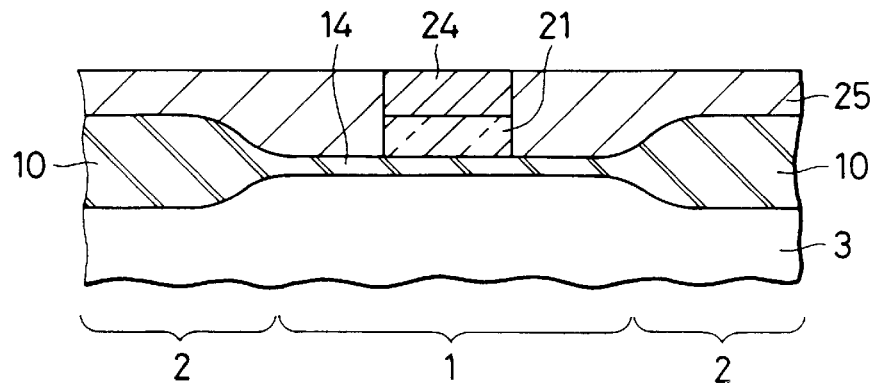

Further, the PZT layer 22 is subjected to a subsequent sintering process at a temperature of 650° C. At this stage, the part 24 of the PZT layer 22 located on the Ir/IrO$_2$ layer 21 has a ferroelectric property, because the Ir/IrO$_2$ layer 21 promotes the crystallization of the part of the PZT layer 22. The state at this stage is shown in FIG. 13B.

Subsequently, a platinum (Pt) layer (not shown) with a thickness of approximately 500 nm is formed on the ferroelectric PZT layer 24 and the dielectric PZT layer 25 over the whole substrate 3 by a popular process. The thick Pt layer thus formed is contacted with and electrically connected to the underlying ferroelectric PZT layer 24.

The Pt layer, the ferroelectric PZT layer 24, and the Ir/IrO$_2$ layer 21 are then patterned by milling and dry etching processes to have the linear plan shape, thereby forming the gate electrode 19. The SiO$_2$ layer 14 is exposed in the device region except for the area where the gate electrode 19 is located.

Following this, using the patterned gate electrode 19 as a mask, proper dopant ions are selectively implanted into the substrate 3 in self-alignment with the gate electrode 19 and the field oxide layer 10 through the $SiO_2$ layer 14. As a result, the source region 5 and the drain region 6 are formed in the device region 1 at each side of the gate electrode 19.

Thus, the semiconductor device according to the fourth embodiment of FIGS. 5 and 12 is finished.

With the semiconductor device according to the fourth embodiment, the $SiO_2$ layer 14 is formed on the surface of the substrate in the whole device region 1, and the patterned ferroelectric PZT layer 24 is formed over the $SiO_2$ layer 14 through the $Ir/IrO_2$ layer 21. Also, the ferroelectric PZT layer 24 and the underlying $Ir/IrO_2$ layer 21 are buried by the dielectric PZT layer 25.

Therefore, no overlapping area is formed between the ferroelectric PZT layer 24 and the dielectric PZT layer 25 or the $SiO_2$ layer 14 or 18. This means that the remanent polarization of the PZT layer 24 is able to be efficiently utilized.

Also, because of the same reason, the semiconductor device according to the fourth embodiment can be readily designed even when the semiconductor device is further miniaturized.

In the fourth embodiment, the combination of the $IrO_2$, Ir sublayers, and PZT layers 21a, 21b, and 24 may be replaced with a $CeO_2$ layer and a ferroelectric PT layer, respectively.

FIFTH EMBODIMENT

Figure 14:
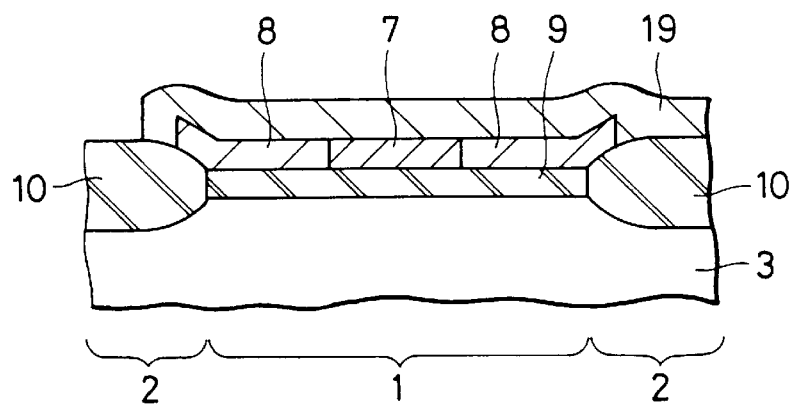
FIG. 14 is a partial cross-sectional view showing a main part of a semiconductor device according to a fifth embodiment of the present invention, which is along the line VI-VI in FIG. 5.

A semiconductor device with a MISFET according to a fifth embodiment is shown in FIGS. 5 and 14, in which the substrate 3, the device region 1, the isolation region 2, and the field oxide layer 10 are the same in configuration as those in the first embodiment.

Therefore, for the sake of simplification of description, the description relating to the same configuration is omitted here by adding the same reference numerals in FIG. 14 as those in the device according to the first embodiment.

In the semiconductor device according to the fifth embodiment, similar to the first embodiment, a thin dielectric layer 9 of $SiO_2$ is formed to be contacted with the exposed surface of the substrate 3 in the device region 1. However, unlike the first embodiment, the dielectric layer 9 has no penetrating window.

The $SiO_2$ layer 9 is contacted with the underlying substrate 3 in the whole device region 1. The periphery of the layer 9 is joined to the opposing end of the field oxide layer 10.

A patterned ferroelectric PZT layer 7 is formed on the $SiO_2$ layer 9. The layer 7 has a rectangular plan shape located approximately the center of the device region 1.

A dielectric PZT layer 8 is formed on the $SiO_2$ layer 9. The layer 8 has a rectangular plan shape covering the whole device region 1 except for the area where the ferroelectric PZT layer 7 is located. The periphery of the dielectric PZT layer 8 is placed on the field oxide layer 10.

A gate electrode 19 of the MISFET, which has a linear plan shape, is formed to intersect the device region 1 The gate electrode 19 extends along the longitudinal axis of the device region 1 to be contacted with the underlying ferroelectric and dielectric PZT layers 7 and 8. The gate electrode 19 runs through the widthwise center of the device region 1. The gate electrode 19 has the same plan shape as that of the layers 8 and 9, and is completely overlapped therewith.

As shown in FIG. 5, a source region 5 and a drain region 6 of the MISFET are formed in the surface region of the substrate 3 in device region 1. The source and drain regions 5 and 6 are symmetrically located at each side of the gate electrode 19. In other words, the gate electrode 19 is placed between the source and drain regions 5 and 6.

A channel region is formed in the surface region of the substrate 3 between the source and drain regions 5 and 6 beneath the gate electrode 19.

The above-described semiconductor device according to the fifth embodiment is fabricated through the following process steps.

Figure 15A:
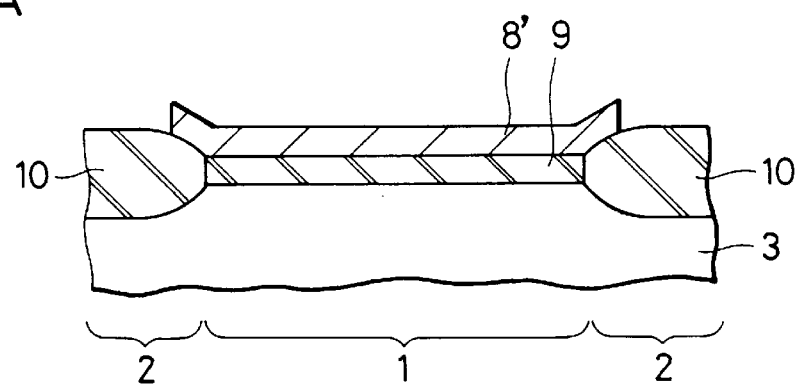
FIGS. 15A and 15B are partial cross-sectional views showing a fabrication method of the semiconductor device according to the fifth embodiment, respectively.

First, the isolation oxide layer 10 is selectively formed on the main surface of the silicon substrate 3, defining the plurality of device region 1 on the substrate 3 by the isolation region 2. The substrate 3 is exposed from the field oxide layer 10 in the device region 1, as shown in FIG. 15A.

Next, the substrate 3 with the field oxide layer 10 is subjected to a thermal oxidation process to form the $SiO_2$ layer 9 with a thickness of approximately 50 nm on the exposed substrate 3 in the device region 1. The $SiO_2$ layer 9 covers the whole device region 1 and is contacted with the whole exposed substrate 3.

Then, a dielectric PZT layer 8' is formed on the dielectric layer 9 and the field oxide layer 10 over the whole substrate 3 by a sol-gel or sputtering process. The layer 8' is then patterned to have the rectangular plan shape covering the whole device region 1. The state at this stage is shown in FIG. 15A.

Figure 15B:
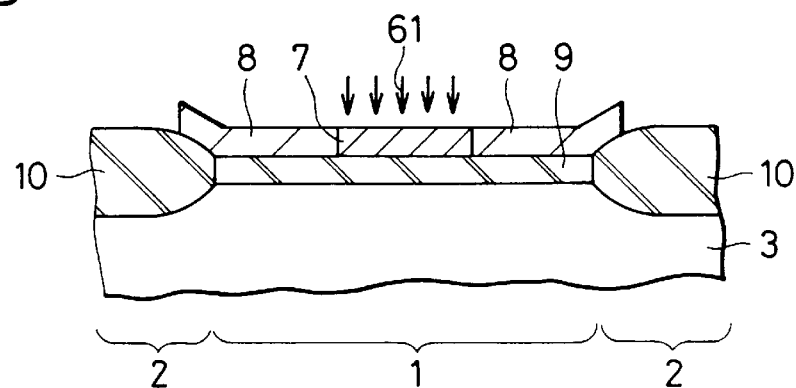

The dielectric PT layer 8' is selectively irradiated to a laser beam 61 to raise the temperature of the irradiated area to 600° C. or higher. Thus, the irradiated area of the PT layer 8' is crystallized to thereby form the ferroelectric layer 7. The state at this stage is shown in FIG. 15B.

Subsequently, a platinum (Pt) layer (not shown) is formed on the dielectric and ferroelectric layers 8 and 9 and the field oxide layer 10 over the whole substrate 3 by a popular process.

The Pt layer is then patterned by dry etching and milling processes to have a linear plan shape with a same width as that of the gate electrode 19.

Following this, using the Pt gate electrode 19 as a mask, proper dopant ions are selectively implanted into the substrate 3 in self-alignment with the gate electrode 19 and the field oxide layer 10 through the dielectric layer 9. As a result, the source region 5 and the drain region 6 are formed in the device region 1 at each side of the gate electrode 19.

Thus, the semiconductor device according to the fifth embodiment of FIGS. 5 and 14 is finished.

With the semiconductor device according to the fifth embodiment, no overlapping area is formed between the ferroelectric PZT layer 7 and the $SiO_2$ layer 9 or dielectric PZT layer 8. This means that the remanent polarization of the ferroelectric layer 7 is able to be efficiently utilized.

Also, because of the same reason, the semiconductor device according to the fifth embodiment can be readily designed even when the semiconductor device is further miniaturized.

SIXTH EMBODIMENT

Figure 16:
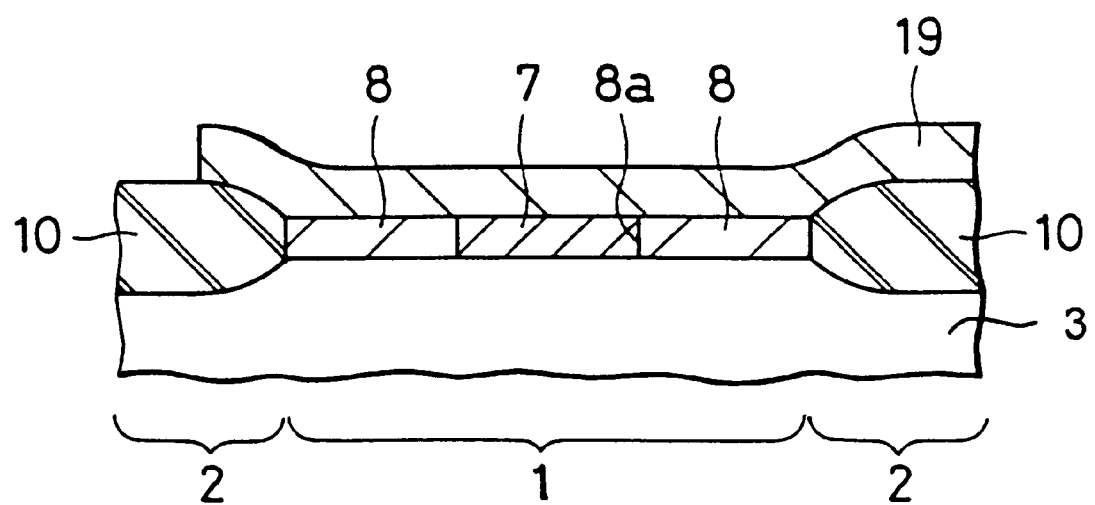
FIG. 16 is a partial cross-sectional view showing a main part of a semiconductor device according to a sixth embodiment of the present invention, which is along the line VI—VI in FIG. 5.

A semiconductor device with a MISFET according to a sixth embodiment is shown in FIGS. 5 and 16, in which the substrate 3, the device region 1, the isolation region 2, and the field oxide layer 10 are the same in configuration as those in the first embodiment.

Therefore, for the sake of simplification of description, the description relating to the same configuration is omitted here by adding the same reference numerals in FIG. 16 as those in the device according to the first embodiment.

In the semiconductor device according to the sixth embodiment, unlike the first embodiment, no dielectric layer is formed on the main surface of the substrate 3 to be contacted therewith in the device region 1. A SiO₂ layer 8 is formed on the whole exposed surface of the substrate 10 to be contacted therewith in the device region 1. The periphery of the layer 8 is joined to the opposing end of the field oxide layer 10.

A patterned ferroelectric PZT layer 7 is formed on the substrate 3 to be buried in the window Ba of the SiO₂ layer 8. The layer 7 has a rectangular plan shape located approximately the center of the device region 1. The top of the PZT layer 7 is in an approximately same level as that of the SiO₂ layer 8.

A gate electrode 19 of the MISFET, which has a linear plan shape, is formed to intersect the device region 1. The gate electrode 19 extends along the longitudinal axis of the device region 1 to be contacted with the underlying layers 7 and B. The gate electrode 4 runs through the width wise center of the device region 1. The gate electrode 4 has the same plan shape as that of the layers 7 and 8, and is completely overlapped therewith.

As shown in FIG. 5, a source region 5 and a drain region 6 of the MISFET are formed in the surface region of the substrate 3 in device region 1. The source and drain regions 5 and 6 are symmetrically located at each side of the gate electrode 19. In other words, the gate electrode 19 is placed between the source and drain regions 5 and 6.

A channel region is formed in the surface region of the substrate 3 between the source and drain regions 5 and 6 beneath the gate electrode 19

The above-described semiconductor device according to the sixth embodiment is fabricated through the same following process steps at those in the first embodiment, except that the part of the ferroelectric PZT layer 7 on the substrate 3 is entirely etched away in a dry etching process after forming the layer 7.

With the semiconductor device according to the sixth embodiment, the same advantages as those in the first embodiment can be obtained.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:
    a semiconductor substrate;
    a source region and a drain region formed to be apart from each other in said substrate;
    a gate insulator formed on a main surface of said substrate, said gate insulator comprising a ferroelectric region and a dielectric region located in a same level as said ferroelectric region;
    a gate electrode formed on said gate insulator;
    said ferroelectric region contacting said main surface of said substrate such that it does not overlap with said dielectric region, and further contacting said gate electrode; and
    said dielectric region contacting said main surface of said substrate and said ferroelectric region.

2. A device as claimed in claim 1, wherein said ferroelectric region includes an additional region formed on said dielectric, said additional region of said ferroelectric region further contacts said gate electrode on a surface opposing said dielectric region.

3. A device as claimed in claim 1, wherein said ferroelectric region is made of a ferroelectric material excluding oxygen.

4. A device as claimed in claim 3, wherein said ferroelectric material excluding oxygen is BaMgF₄.

5. A semiconductor device comprising:
    a semiconductor substrate;
    a source region and a drain region formed to be apart from each other in said substrate;
    a gate insulator formed on a main surface of said substrate;
    a gate electrode formed on said gate insulator;
    said gate insulator including a lower dielectric layer, an interleaving region, and a ferroelectric region formed on said interleaving region, and an upper dielectric region;
    said lower dielectric layer contacting said main surface of said substrate;
    said ferroelectric region being located on said interleaving region and through said upper dielectric region;
    said interleaving region positioned between said lower dielectric layer and said upper dielectric region; and
    an entire bottom surface of said ferroelectric region contacting said interleaving region such that no overlap exists between said ferroelectric region and said upper dielectric region.

6. A device as claimed in claim 5, wherein said dielectric layer has a two-layer structure including a lower dielectric sublayer and an upper dielectric sublayer.

7. A device as claimed in claim 6, wherein said upper dielectric sublayer is made of CeO₂.

* * * * *